United States Patent [19]

Feuerbaum

[11] 4,223,220
[45] Sep. 16, 1980

[54] METHOD FOR ELECTRONICALLY IMAGING THE POTENTIAL DISTRIBUTION IN AN ELECTRONIC COMPONENT AND ARRANGEMENT FOR IMPLEMENTING THE METHOD

[75] Inventor: Hans P. Feuerbaum, Munich, Fed. Rep. of Germany

[73] Assignee: Siemens Aktiengesellschaft, Munich, Fed. Rep. of Germany

[21] Appl. No.: 22,493

[22] Filed: Mar. 21, 1979

[30] Foreign Application Priority Data

Mar. 31, 1978 [DE] Fed. Rep. of Germany ....... 2813948

[51] Int. Cl.$^2$ ............................................. G01N 23/00
[52] U.S. Cl. ................................. 250/310; 324/158 D
[58] Field of Search ............... 250/306, 307, 310, 311, 250/397, 305; 324/158 D

[56] References Cited

U.S. PATENT DOCUMENTS

| | | | |
|---|---|---|---|
| 3,531,716 | 9/1970 | Tarui et al. ........................... | 250/310 |
| 3,549,999 | 12/1970 | Norton ............................ | 324/158 D |
| 3,764,898 | 10/1973 | Bohlen et al. ......................... | 250/310 |
| 3,956,698 | 5/1976 | Malmberg et al. .............. | 324/158 D |

OTHER PUBLICATIONS

"Voltage Coding: Temporal vs. Spatial Frequencies," Lukianoff et al., *Scanning Elec. Micro,* 1975, pp. 465-471.
"Stroboscopic Scanning Electron Microscope," Plows et al., *J. of Sci. Ins.,* 1968, series 2, vol. 1, pp. 595-600.

*Primary Examiner*—Bruce C. Anderson
*Attorney, Agent, or Firm*—Kenyon & Kenyon

[57] ABSTRACT

A method for electronically imaging the potential distribution in an electronic component such as an integrated circuit in which the phase of the pulses of the primary electron beam is shifted by a time delay with respect to the potential distribution in the component with a multiple of the frequency of the line deflection of the primary electron beam on the component and a frequency synchronous therewith chosen as the frequency of the time delay.

4 Claims, 6 Drawing Figures

METHOD FOR ELECTRONICALLY IMAGING THE POTENTIAL DISTRIBUTION IN AN ELECTRONIC COMPONENT AND ARRANGEMENT FOR IMPLEMENTING THE METHOD

BACKGROUND OF THE INVENTION

The invention relates to a method for electronically imaging the potential distribution in an electronic component by contactless potential measurements with a scanning electron microscope, the primary electron beam of which is keyed and is directed, through deflection, in lines across the component, particularly an integrated circuit, and for display as a potential contrast on a picture screen.

It is known that for functional testing of electronic components with a scanning electron microscope, a method which is called "voltage coding" in the literature can be used. The potential distribution of the component is then imaged on a television screen by having the primary electron beam scan, interlaced, the component in accordance with television principles. The electronic component, for instance, an integrated circuit, is addressed by signals, the frequency of which is a multiple of the line frequency of the picture screen.

At the measuring point, the primary electron beam releases secondary electrons from the metallic conductor, the number of which is determined by the potential of the measuring point. At a measuring point with positive potential, relatively few secondary electrons are released; this results in a correspondingly low brightness on the picture screen. Zero potential or negative potential at the measuring point results in a correspondingly high brightness on the picture screen, and the potential distribution can therefore be made visible by this potential contrast on the picture screen.

Television picture screens work with a line frequency of about 15 kHz. The electron beam is generally led over the picture screen in 625 lines. While scanning an integrated circuit, the potential distribution of which changes, for instance, with a frequency of 60 kHz, the primary electron beam detects the potential change 8 times during a line sweep. The signals displayed on the picture screen can be correlated in time, and any time displacement of the potential can be recognized visually. However, due to the relatively low signal-to-noise ratio, television quality of the picture is not achieved. It therefore becomes necessary to adjust a relatively large primary electron current. This large current, on the other hand, prevents resolution and can furthermore be harmful to sensitive electronic components. In addition, the amplifiers of the electronic signal processing circuits have only a relatively small bandwidth, so that potentials which change with a very high frequency cannot be imaged. (Scanning Electron Microsopy/1975 (Part i), IITRI Chicago, USA, April 1975, pages 456–471).

Also known is a device for pictorially displaying the potential distribution of high frequency signals at the surface of an electronic component stroboscopically, using the principle of a sampling oscilloscope which is equipped with a gating device for the primary electron beam. The pulsed primary electron beam is led across the component in lines by means of a deflection device. The pulses of the primary electron beams have a fixed phase relationship with respect to the potential at the measuring point and one obtains an image of the static potential distribution at the surface of the component at a predetermined phase. By shifting the phase, respective other images are obtained. While these individual images can be compared, it is not possible to see the instantaneous change of the potential pattern in time ("J. Sci. Instr." 1968, Series 2, Vol. 1, pages 595 to 600).

SUMMARY OF THE INVENTION

It is therefore an object of the present invention to describe a method for electronically imaging the potential distribution of electronic components, by means of which potentials which change with a high frequency can also be detected. The achievement of this object, in accordance with the present invention, is based on the discovery that, deviating from the known television mode of operation, a pictorial display of the dynamic potential distribution is also possible with the keyed electron beam, utilizing the stroboscope effect, if only the potential contrast is picked up, without quantitative measurement.

The stated problem is therefore solved, according to the present invention, by the provision that the pulses of the primary electron beam are phase-shifted with respect to the potential distribution and that a multiple of the frequency of the line deflection frequency of the primary electron beam on the component is chosen as the frequency of the time delay, and that the time delay is synchronous with the line deflection. With this method, the phase is swept from 0° to 360° several times during a line by controlling the time delay. The phase change becomes visible through the potential contrast on the picture screen, and the dynamic potential distribution can also be seen on the picture screen. High time resolution is obtained, which yields a bandwith of up to several GHz. Therefore, signal flanks in the potential patterns can also be examined. Because of the stroboscope effect, one further obtains a correspondingly high signal-to-noise ratio.

For implementing the method according to the present invention, the known device for electronically recording images with a scanning electron microscope which is equipped with a keying device and line deflection for the primary electron beam, is expanded. It can be equipped, for instance, with a synchronizing device which controls the keying device for the primary electron beam via a time delay generator. This synchronizing device at the same time controls the line deflection of the primary electron beam synchronously via a raster generator.

In a special embodiment of the apparatus, the raster generator can further be preceded by a separate frequency divider which controls the raster generator with a reduced frequency synchronously with the time delay for the gating device. The time delay for the gating device can be controlled, for instance, by the raster generator via a multiplier.

DETAILED DESCRIPTION OF THE INVENTION

Figure 1:
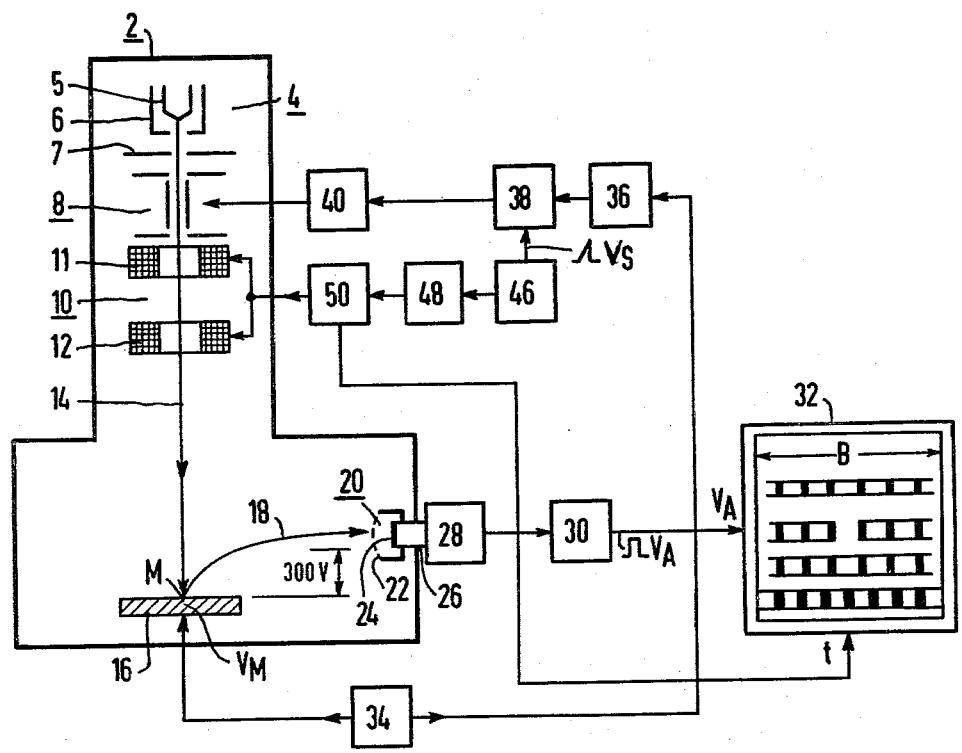
FIG. 1 is a block diagram of an example of an arrangement for implementing the method according to the present invention.

In FIG. 1, a scanning electron microscope 2, contains an electron gun 4 for a primary electron beam 14 and a keying or gating device 8 as well as a beam deflection system 10. The electron gun 4 consists essentially of a cathode 5, a control electrode 6 and an anode 7. The electron beam deflection system 10 can contain, for instance, a coil system with deflection coils 11 and 12, the magnetic field of which is used for line deflection of the primary electron beam 14 over an electronic component 16, which can preferably be an integrated circuit and is simply called the sample in the following description, and the potential distribution of which is to be made visible on a picture screen. The primary electron beam 14 releases secondary electrons 18 at a measuring point M, the number of which depends on the potential at the measuring point M. The secondary electrons 18 arrive at an electron collector 20, which can consist, for instance, of a collector screen 22 and a scintillator 24 with a light guide 26, and with which a photo multiplier 28 is associated which is in general coupled to a very sensitive preamplifier, not shown in the figure. Between the measurement point M and the collector screen 22 there is a potential difference of, for instance, 300 V. The output signal of the photo multiplier 28 is fed to an amplifier 30, the output signal $V_A$ of which controls the voltage at the control electrode of the picture screen 32 and thus, the amplitude of the picture screen signal.

The time sweep t of the picture screen 32, i.e., the line control, is provided by a raster generator 50, which simultaneously controls the deflection system 10 for the primary electron beam 14.

The sample 16 receives its supply voltages as well as timing and test patterns from control logic 34 which, at the same time, controls, via a rate generator 36 which serves as a pulse former, a time delay generator 38 which forms, together with a pulse generator 40, the control device for the gating device 8. The delay of the pulses of the delay generator 38 is determined by a sequence of sawteeth $V_s$, which is provided by a synchronizing device 46. This synchronizing device 46, simultaneously, controls, preferably via a frequency divider 48 and the raster generator 10, the deflection system 10 for the primary electron beam 14. The frequency divider 48 divides the frequency of the sawteeth $V_s$ of the synchronizing device 46 by an integral number.

In another embodiment of the measuring arrangement, not shown in the figure, the delay is controlled by the raster generator 50. In this embodiment, the raster generator 50 is followed by a multiplier which is not shown in the figure and drives the delay generator 38 via the synchronizing device 46 with a correspondingly increased number of pulses.

By means of the synchronizing device 46, the delay of the pulses of the primary electron beam 14 is controlled so that, during a line sweep on the picture screen 32, a cycle of the potential at the measuring point M is traversed several times from 0° to 360°. The phase change is then controlled synchronously by the frequency divider 48 and the multiplier mentioned, respectively.

Figure 2:
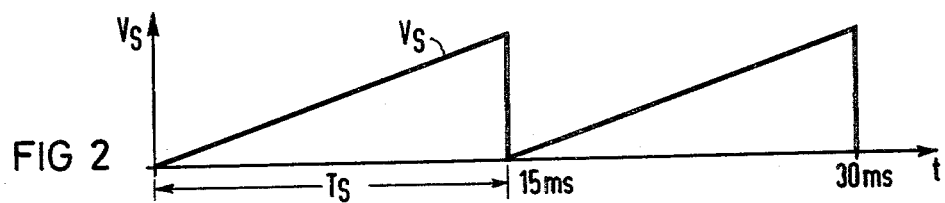
FIGS. 2 to 6 illustrate the process steps of the present invention in various diagrams.
Figure 3:
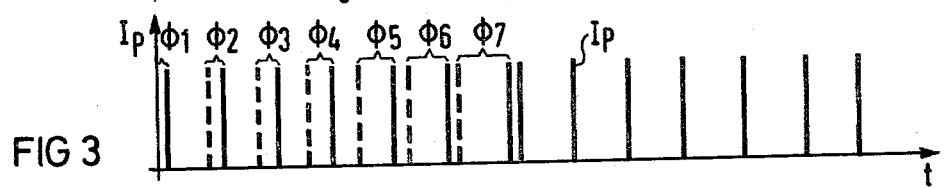

In FIG. 2, the sawtooth voltage $V_s$ of the synchronizing device 46 is plotted as a function of the time t. With increasing height of the rising flank of the sawtooth $V_s$, the phase of the output pulse of the time delay generator 38 and thereby, also the phase of the pulses $I_p$ of the primary electron beam 14, are continuously shifted, as can be seen in the diagram according to FIG. 3, in which these pulses $I_p$ of the primary electron beam 14 are plotted as a function of the time t. With increasing sawtooth voltage $V_s$, the phase $\phi_1$ to $\phi_7$ of the pulses $I_o$ changes relative to a reference phase, not specifically indicated here. For the sake of simplification, only seven pulses $I_p$ of the primary electron beam 14 are indicated within a sweep $T_s$ of a sawtooth of the sawtooth of the sawtooth voltage $V_s$. In the practical embodiment of an arrangement for implementing the method, preferably at least 100 pulses and in particular, at least 1000 pulses $I_p$ are applied to the same 16 during the sweep time $T_s$ of, say, 15 ms.

Figure 4:
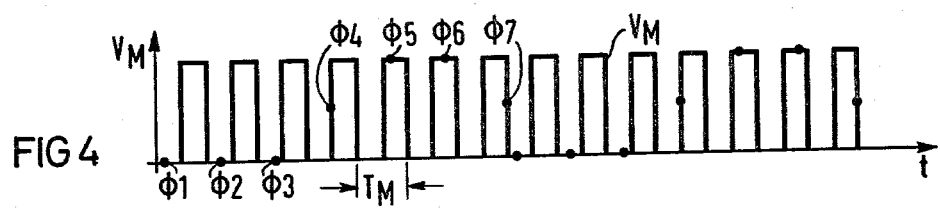

By the time delay of the control pulses of the keying device 8, the pulses $I_p$ of the primary electron beam 14 are shifted over a cycle with respect to the potential at the measuring point M, as can be seen from the diagram according to FIG. 4, in which the measuring voltage $V_M$ at the measuring point M is plotted as a function of the time t. With the phase shift of $\phi_1$ to $\phi_3$, the pulses $I_p$ still remain in the intervals of the pulse sequence of the measuring voltage $V_M$, which are assumed to be square pulses. The phase $\phi_4$ is to be on the rising flank of the pulse of the voltage $V_M$.

The two phases $\phi_5$ and $\phi_6$ are to be at the crest of the cycle of the measuring voltage $V_M$ and the phase $\phi_7$ at the falling flank. Similarly, the phase of the pulses $I_p$ of the primary electron beam 14 is shifted with the following sawtooth of the voltage $V_s$ over one cycle of the measuring voltage $V_M$.

Figure 5:
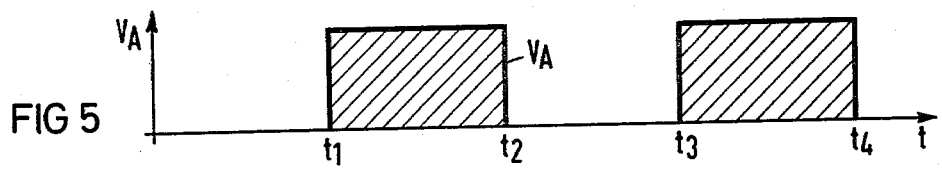

With the shift of the pulses $I_p$ into the pulse of the measuring voltage $V_M$, the amplifier 30 delivers, at the time $t_1$, an output signal such as is indicated in FIG. 5, in which the output voltage $V_A$ of the amplifier 30 is plotted as a function of the time t. This signal ends at the time $t_2$ with the end of the sawtooth $V_s$ and the shift of the pulses $I_p$ into the intervals of the measuring voltage $V_M$. Similarly, an amplifier output signal $V_A$ is delivered from $t_3$ to $t_4$.

Figure 6:
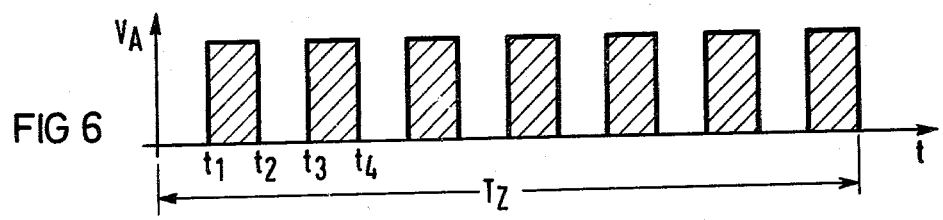

During a line sweep of the primary electron beam 14, seven sawtooth signals $V_s$, for instance, are to be furnished by the synchronizing device 46, according to the diagram of FIG. 6. Thus, the cycle $T_M$ of the measuring voltage $V_M$ is traversed 7 times by phase shifting during the period $T_z$ of one line. Accordingly, seven pulses of the output voltage $V_A$ delivered by the amplifier 30 appear across the width B of the picture screen 2 of FIG. 1. In the sweep time, the intervals of the measuring voltage $V_M$ are bright, corresponding to the zero potential, and the pulses, for instance, from $t_1$ to $t_2$ and $t_3$ to $t_4$, are dark, corresponding to the positive potential of the measuring voltage $V_M$.

The frequency $f_s=1/T_s$ of the time delay of the phase control is chosen as a multiple of the frequency of $f_z=1/T_z$ of the line deflection of the electron beam 14, and synchronous with the line deflection.

Because of the finite thickness of the conductors on the sample 16, several lines appear with the same bright-dark distribution on the picture screen 32. As soon as the electron beam scans another conductor with a different potential distribution, a correspondingly different image is also obtained due to the potential contrast.

What is claimed is:

1. A method for electronically imaging the potential distribution in an electronic component by contactless potential measurements with a scanning electron microscope, the primary electron beam of which is keyed and is scanned across the component in lines to form a raster by deflection means, and for display as potential contrast on a picture screen scanned in synchronism therewith, comprising:

(a) shifting the phase of the pulses of the primary electron beam over a range of time delays with respect to a reference phase of the potential distribution in the component;

(b) using a multiple of the frequency of the line deflection of the primary electron beam on the component as the frequency of shifting the time delay; and (c) causing the shifting of the phase over a range of time delays to be synchronous with the line deflection.

2. Apparatus for electronically imaging the potential distribution in an electronic component by contactless potential measurements with a scanning electron microscope, the primary electron beam of which is keyed by a keying device and is scanned across the component in lines to form a raster by deflection means, and for display as potential contrast on a picture screen, comprising:

(a) a time delay generator providing an output to control the phase of the keying device;

(b) a raster generator coupled to the microscope to control scanning thereof; and (c) a synchronizing device having outputs coupled to said time delay generator and said raster generator wherein said keying device and the deflection of said primary electron beam will be controlled synchronously.

3. Apparatus according to claim 2, and further including a frequency divider interposed between said raster generator and said synchronizing device.

4. Apparatus according to claim 2, and further includes a multiplier between said time delay generator and said synchronizing device to control said time delay generator as a function of the output signal of the raster generator.

* * * * *